United States Patent
Wu et al.

(10) Patent No.: US 7,294,958 B2
(45) Date of Patent: Nov. 13, 2007

(54) DISPLAY PANEL, ELECTRODE PANEL AND ELECTRODE SUBSTRATE THEREOF

(75) Inventors: Chao Chin Wu, Taipei County (TW); Meng-Chieh Liao, Hsinchu (TW); Jiun-Haw Lee, Taipei (TW)

(73) Assignee: Rit Display Corporation, Hinchu (TW)

( * ) Notice: Subject to any disclaimer, the term of this patent is extended or adjusted under 35 U.S.C. 154(b) by 87 days.

(21) Appl. No.: 10/878,126

(22) Filed: Jun. 29, 2004

(65) Prior Publication Data

US 2004/0263059 A1    Dec. 30, 2004

(30) Foreign Application Priority Data

Jun. 30, 2003    (TW) ............................... 92117862 A

(51) Int. Cl.
*H01J 1/62* (2006.01)
*H01J 63/04* (2006.01)
*B32B 9/00* (2006.01)

(52) U.S. Cl. ..................... 313/500; 313/505; 313/506; 313/498; 313/511; 428/690; 428/917

(58) Field of Classification Search ............... 313/495, 313/500, 505
See application file for complete search history.

(56) References Cited

U.S. PATENT DOCUMENTS

| | | | | |
|---|---|---|---|---|
| 5,578,896 A | * | 11/1996 | Huang | 313/309 |
| 5,955,850 A | * | 9/1999 | Yamaguchi et al. | 313/495 |
| 6,002,206 A | * | 12/1999 | Harrison et al. | 313/506 |
| 6,064,358 A | * | 5/2000 | Kitajima et al. | 345/88 |
| 6,313,572 B1 | * | 11/2001 | Yamada | 313/310 |
| 6,483,123 B1 | * | 11/2002 | Kim et al. | 257/40 |
| 6,822,380 B2 | * | 11/2004 | Sheng et al. | 313/310 |
| 2003/0122498 A1 | * | 7/2003 | Park | 315/169.3 |

* cited by examiner

*Primary Examiner*—Sikha Roy
*Assistant Examiner*—Natalie K. Walford
(74) *Attorney, Agent, or Firm*—WPAT, P.C.; Anthony King

(57) ABSTRACT

An electrode substrate of a flat panel display at least comprises a substrate, an electrode layer, a first barrier layer, a second barrier layer and a conductive layer. The electrode layer is disposed above the substrate. The first barrier layer is disposed above the electrode layer. The second barrier layer is disposed above the first barrier layer. The conductive layer is disposed between the first barrier layer and the second barrier layer.

20 Claims, 3 Drawing Sheets

DISPLAY PANEL, ELECTRODE PANEL AND ELECTRODE SUBSTRATE THEREOF

BACKGROUND OF THE INVENTION

This Non-provisional application claims priority under 35 U.S.C. § 119(a) on Patent Application No(s). 092117862 filed in Taiwan on Jun. 30, 2003, the entire contents of which are hereby incorporated by reference.

1. Field of Invention

The invention relates to a display panel, an electrode substrate and an electrode panel thereof and, in particular, to a display panel of a flat panel display, an electrode substrate of a flat panel display, and an electrode panel of a flat panel display.

2. Related Art

Referring to FIG. 1, the currently used electrode substrate 4 of a flat panel display includes a substrate 41, an electrode layer 42, and a conductive layer 43. The electrode layer 42 is disposed on the substrate 41, and the conductive layer 43 is disposed on the electrode layer 42. The material of the conductive layer 43 is selected from low resistance metals or the alloys thereof, such as a commonly used chromium or silver alloy.

In the manufacturing processes of the flat panel display, an etchant is used to etch the conductive layer 43 of the electrode substrate 4 into required pattern of conductive lines or the pattern of auxiliary conductive lines. Then, a light-emitting region and a corresponding electrode are formed above the electrode substrate 4, and finally the electrode substrate 4 is combined with a driving device (e.g., a driving chip) to form the display panel.

During the process of forming the pattern of conductive lines or the pattern of auxiliary conductive lines on the electrode substrate 4, a photoresist layer 5 is provided on the conductive layer 43 (e.g. silver alloy), and a patterned mask 6 is then set on the photoresist layer 5. At the meanwhile, an ultra-violet light (UV light) is illuminated, as shown in FIG. 2. Thereafter, a development step is performed. Finally, the etchant is used to etch the conductive layer 43 into required pattern of the conductive lines 431. However, the conductive layer 43 (e.g. silver alloy) tends to be oxidized (becomes black) owing to the exposure of the UV light, thereby increasing the resistance of the conductive layer 43 and reducing the adhesion force between the conductive layer 43 and the photoresist layer 5. Meanwhile, in the subsequent processes, the driving device (e.g. driving chip) is pressed and adhered onto the conductive lines 431, the oxidized conductive lines 431 cannot be easily adhered to the driving device. The driving device tends to be peeled or separated from the conductive lines 431, thereby influencing the reliability of the display panel. In addition, when the display panel works, the conductive lines 431 also tend to react with the external oxygen or sulfur. Thus, the conductive lines 431 tend to be oxidized or even burnt out owing to the heat generated when the current flows therethrough.

In viewing the above, a commonly used active matrix liquid crystal display (AM-LCD) utilizes the metal conductive lines, which are made of transition metals such as manganese (Mn), chromium (Cr), tantalum (Ta), or the alloys thereof. When forming the metal conductive lines by thin-film deposition, the thickness of the metal conductive lines should be contracted so as to obtain good step-coverage. However, the thinner metal conductive lines may increase the resistance of the conductive lines, resulting in that the RC-delay of signals is enlarged. Therefore, the size of the flat panel display composing of the transition metals is restricted. To manufacture large size flat panel display, the manufacturing process or material for forming the metal conductive lines with ultra-low resistance is necessarily developed.

In the view of metal conductive line manufacturing process, the thicker and wider metal thin film is employed to obtain lower resistance. The thicker metal thin film, however, has the drawbacks of worse adhesion and pinhole formation. In the current moment, although a special taper etching process is used to improve the drawbacks, the manufacturing cost is increased accordingly. Moreover, the wider metal thin film not only decreases the aspect ratio of the pixels, but also increases the parasitic capacitance of the conductive lines. Thus, the thicker and wider metal conductive lines can not be applied to flat panel display.

Recently, those skilled in the art have disclosed a planarization metal conductive line manufacturing process to improve the adhesion and to reduce the pinhole formation. However, the planarization process needs additional processing steps and materials, and the result of the planarization may further increase the parasitic capacitance. In summary, improving the material is the proper way to solve the above-mentioned problems.

According to the above-mentioned requirements, aluminum, which has low resistance and is simply to be used in the process. Since aluminum may generate hillocks when applying high temperature and large current, the conductive line made of aluminum is then shortened or opened. This may result in the reliability problem of the flat panel display. Alternatively, copper, which has lower resistance, is another preferred material. However, copper is bad adhering to the glass substrate, the surface of copper is easy to be oxidized, and copper is hard to be etched away. Therefore, the change of the manufacturing process or the composition is inevitable, which results in the increase of the manufacturing cost and complexity. This is not matching the requirement for mass production of organic electroluminescent device.

Besides, in the manufacturing process of a TFT-LCD, the three-layer structure, such as Cr/Al/Cr or Mo/Al/Mo, is used as the material of the conductive lines, so as to prevent the above-mentioned problems. For manufacturing such conductive lines, two different etchants are necessary. Firstly, a first etchant is used to etch the upper metal chromium (Cr) or molybdenum (Mo), and a second etchant is then used to etch the middle metal aluminum (Al). Finally, the first etchant is used again to etch the bottom metal chromium (Cr) or molybdenum (Mo). Thus, three times of etching processes are necessary, resulting in complex manufacturing processes and increasing the cost. In practice, the three-layer structure is unsuitable for the industrial application. This invention is therefore to provide a display panel and an electrode panel and an electrode substrate thereof, which can solve the above-mentioned problems.

SUMMARY OF THE INVENTION

In view of the above-mentioned problems, this invention is to provide a display panel having two barrier layers, an electrode substrate and electrode panel for the display panel. The barrier layers can protect the conductive layer (conductive lines) from being oxidized and burnt out, and also control the shapes of the patterned conductive lines.

In this invention, the display panel, electrode substrate and electrode panel thereof are applied to a flat panel display.

This invention provides an electrode substrate of a flat panel display, which at least comprises a substrate, an electrode layer, a first barrier layer, a second barrier layer, and a conductive layer. The electrode layer is disposed above the substrate, the first barrier layer is disposed above the electrode layer, the second barrier layer is disposed above the first barrier layer, and the conductive layer is disposed between the first barrier layer and the second barrier layer.

This invention also provides an electrode panel of a flat panel display. The electrode panel at least comprises a substrate, an electrode layer pattern, a first barrier layer pattern, a second barrier layer pattern, and a conductive line pattern. The electrode layer pattern is disposed above the substrate, the first barrier layer pattern is disposed above the electrode layer pattern, the second barrier layer pattern is disposed above the first barrier layer pattern, and the conductive line pattern is disposed between the first barrier layer pattern and the second barrier layer patterns The conductive line pattern comprises at least one conductive line.

The invention also provides a display panel of a flat panel display. The display panel at least comprises a substrate, a light-emitting region, a driving device, a first barrier layer, a second barrier layer, and a conductive line pattern. The light-emitting region has a plurality of pixels, each of which having a first electrode, a second electrode and a light-emitting layer. The first electrode is disposed above the substrate, the second electrode is disposed above the first electrode, and the light-emitting layer is disposed between the first electrode and the second electrode. The driving device drives the pixels. The first barrier layer is disposed above the substrate, and the second barrier layer is disposed above the first barrier layer. The conductive line pattern is disposed between the first barrier layer and the second barrier layer. The conductive line pattern has a plurality of conductive lines for connecting the first electrodes to the driving device and the second electrodes to the driving device respectively. In the invention, the flat panel display includes but not limited to an organic electroluminescent (OEL) display, an electroluminescent (EL) display, a light-emitting diode (LED) display, a liquid crystal display (LCD), a plasma display panel (PDP), a vacuum fluorescent display (VFD), a field emission display (FED), and an electro-chromic display.

As mentioned above, the display panel of this invention and its electrode substrate and electrode panel has two barrier layers for protecting the conductive layer (conductive lines). Compared to the prior art, this invention possesses the following advantages. Firstly, the barrier layers of the invention can prevent the conductive layer from being oxidized owing to the exposure of the UV light, and thus prevent increasing the resistance of the conductive layer and enhance the adhesion between the conductive layer and the photoresist layer. Meanwhile, when the display panel works, the barrier layers also may prevent the conductive lines from the influence of the external oxygen or sulfur, and thus prevent the conductive lines from being oxidized or even burnt out. Secondly, the adhesions between the conductive lines and the driving device and between the conductive lines and the electrode layer can be improved owing to the barrier layers of the invention, which may further ensure the reliability of the display panel. Thirdly, the invention may further control the shape of the patterned conductive line. For example, regarding to the shape of the cross-section of the conductive line, the middle portion of the conductive line is narrower than the side portions close to the first barrier layer and the second barrier layer, wherein the shape looks like a sandglass. Thus, the adhesion area between the conductive line and the electrode layer and the adhesion area between the conductive line and the driving device are larger than those of the prior art. That is, if the area of the electrode substrate is fixed, the adhesion area between the conductive line and the electrode layer of the invention is larger than that of the prior art. Hence, the adhesions therebetween are more reinforced, so as to ensure the reliability of the display panel. Fourthly, this invention may be implemented using one etchant. Therefore only one etching step is required to simultaneously etch the three-layer structure of the barrier layers and the conductive layer. Fifthly, since this invention is quite suitable in the practical industry because this invention has simple manufacturing processes and the overall cost is not significantly increased.

BRIEF DESCRIPTION OF THE DRAWINGS

The invention will become more fully understood from the detailed description given hereinbelow illustration only, and thus is not limitative of the present invention, and wherein.

DETAILED DESCRIPTION OF THE INVENTION

The present invention will be apparent from the following detailed description, which proceeds with reference to the accompanying drawings, wherein the same references relate to the same elements.

The electrode substrate to be described in the following is an electrode substrate of a flat panel display.

Figure 1:
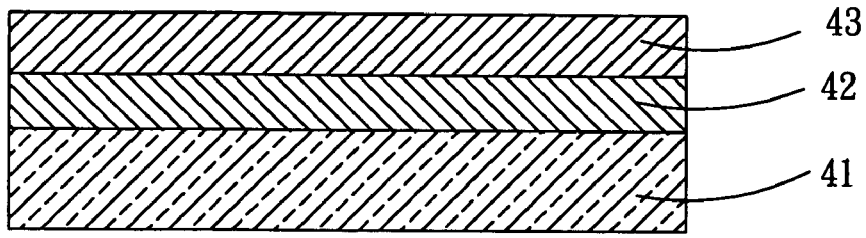
FIG. 1 is a schematic illustration showing an electrode substrate of a conventional flat panel display.
Figure 2:
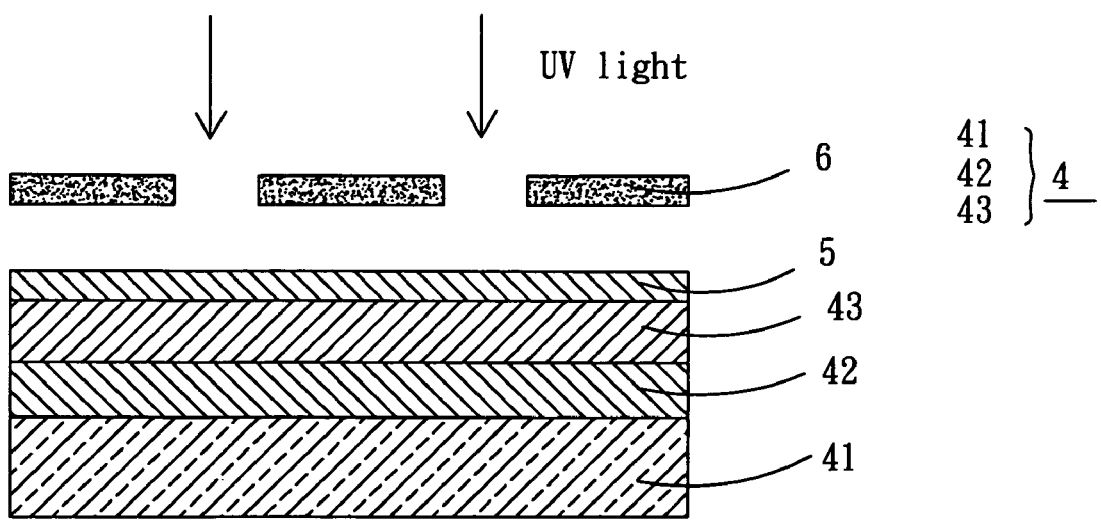
FIG. 2 is a schematic illustration showing the embodied pattern of conductive lines or auxiliary conductive lines formed on the electrode substrate of the conventional flat panel display.
Figure 3:
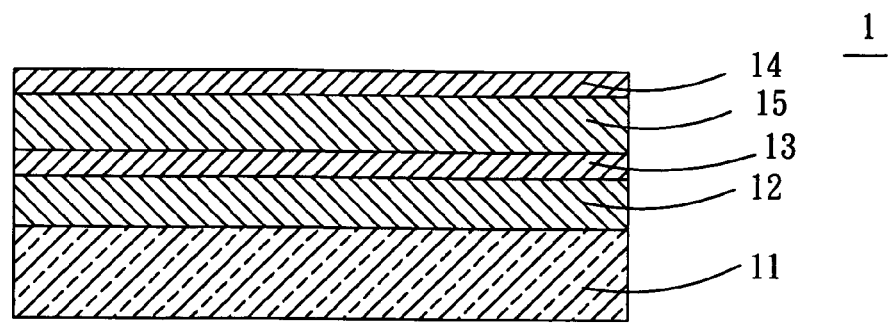
FIG. 3 is a schematic illustration showing an electrode substrate of a flat panel display according to a first embodiment of the invention.

Referring to FIG. 3, an electrode substrate 1 of a flat panel display according to a first embodiment of the invention comprises a substrate 11, an electrode layer 12, a first barrier layer 13, a second barrier layer 14, and a conductive layer 15. The electrode layer 12 is disposed on the substrate 11, the first barrier layer 13 is disposed on the electrode layer 12, the second barrier layer 14 is disposed above the first barrier layer 13, and the conductive layer 15 is disposed between the first barrier layer 13 and the second barrier layer 14.

In the present embodiment, the substrate 11 can be a flexible or a rigid substrate. The substrate 11 can also be a plastic or glass substrate. In particular, the flexible substrate or plastic substrate can be made of polycarbonate (PC), polyester (PET), cyclic olefin copolymer (COC), or metallocene-based cyclic olefin copolymer (mCOC).

Referring to FIG. 3, the electrode layer 12 is disposed on the substrate 11. In this embodiment, the electrode layer 12 is formed on the substrate 11 by sputtering or ion plating. The electrode layer 12 is usually used as an anode and made of a transparent conductive metal oxide, such as indium-tin oxide (ITO), aluminum-zinc oxide (AZO), or indium-zinc oxide (IZO).

With reference to FIG. 3, the first barrier layer 13 of this embodiment is disposed on the electrode layer 12. Herein, the first barrier layer 13 is used to protect the conductive layer 15. The material of the first barrier layer 13 is the titanium or titanium alloy. Since the titanium or titanium alloy is the active metal, the adhesion portion between the first barrier layer 13 and the electrode layer 12 generates a compound, which can improve the adhesion of the first barrier layer 13 and the electrode layer 12. In other words, the adhesion between the first barrier layer 13 and the electrode layer 12 is better than that between the conductive layer 15 itself and the electrode layer 12. That is, the adhesion between the first barrier layer 13 and the electrode layer 12 is enhanced. In addition, a thin, compact, and fine oxidation layer (titanium oxide) may be formed on the surface of the titanium, and the compact and fine oxidation layer is composed of a passivation material with good etching-resistivity. Of course, the material of the first barrier layer 13 may also be the platinum, gold, molybdenum, chromium, platinum-containing alloy, gold-containing alloy, titanium-containing alloy, molybdenum-containing alloy or chromium-containing alloy. Herein, the thickness of the first barrier layer 13 is about 10 Å to 1000 Å.

The second barrier layer 14 of the embodiment shown in FIG. 3 is disposed above the first barrier layer 13. Herein, the second barrier layer 14 protects the conductive layer 15 from being illuminated by the UV light and from oxidation. Similarly, the material of the second barrier layer 14 may be the titanium or titanium alloy, so that the adhesion between the second barrier layer 14 and the driving device is better than that between the conductive layer 15 and the driving device. Of course, the second barrier layer 14 can be the platinum, gold, titanium, molybdenum, chromium, platinum-containing alloy, gold-containing alloy, titanium-containing alloy, molybdenum-containing alloy or chromium-containing alloy. Furthermore, the thickness of the second barrier layer 14 is about 10 Å to 1000 Å. In the embodiment, the features and functions of the second barrier layer 14 are the same as those of the first barrier layer 13, and detailed descriptions thereof will be omitted.

The conductive layer 15 of this embodiment of FIG. 3 is disposed between the first barrier layer 13 and the second barrier layer 14, wherein the material of the conductive layer 15 may be the aluminum, silver, copper, aluminum-containing alloy, silver-containing alloy or copper-containing alloy. Because the metals or the alloys thereof have a low resistance, high electrical conductivity and higher mechanical intensity, they are very suitable for being the wires. Herein, the thickness of the conductive layer 15 is about 100 Å to 10000 Å.

In this embodiment, the thickness of the first barrier layer 13, the second barrier layer 14, and the conductive layer 15 may be adjusted according to the practical condition.

Furthermore, the structure of the first barrier layer 13/the conductive layer 15/the second barrier layer 14 of the embodiment should not include the arrangement of Cr/Al/Cr or Mo/Al/Mo.

In the processes of forming the conductive line pattern or auxiliary conductive line pattern on the electrode substrate 1, a photoresist layer is firstly formed on the second barrier layer 14, a patterned mask is formed on the photoresist layer, and then the UV light is illuminated on the patterned mask and the photoresist layer. Thereafter, the photoresist layer is patterned by the development step. Finally, an etchant is used for etching the photoresist layer to form the required pattern.

In this embodiment, the barrier layers 13, 14 and the conductive layer 15 can be etched by utilizing one etchant. That is, only one etching step is necessary for etching the barrier layers 13, 14 and the conductive layer 15 simultaneously to form the required pattern.

Figure 4:
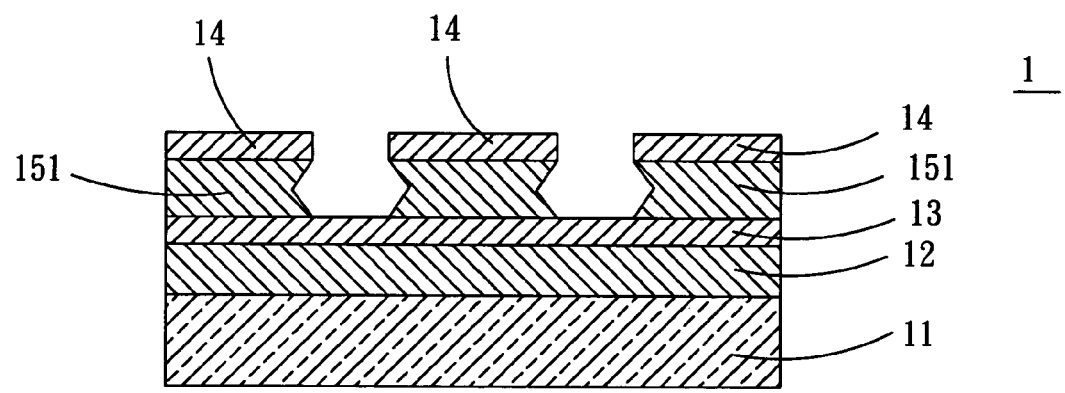
FIG. 4 is a cross-sectional view showing that a pattern of conductive lines or auxiliary conductive lines formed on the electrode substrate of the flat panel display in the first embodiment.

In the embodiment, properly controlling the factors, such as the thickness and material of the barrier layer 13, 14 and the etching parameters in this embodiment can control the shapes of the conductive lines 151 after the conductive layer 15 is etched. As shown in FIG. 4, regarding to the shape of the cross-section of the conductive line 151, the middle portion of the conductive line 151 is narrower than the side portions close to the first barrier layer 13 and the second barrier layer 14, wherein the shape looks like a sandglass. Herein, the adhesion area between the conductive line 151 (and the first barrier layer 13) and the electrode layer 12 and the adhesion area between the conductive line 151 (and the second barrier layer 14) and the driving device (not shown) are larger than those of the prior art. Hence, the adhesions therebetween are more compact and the electrode layer 12 cannot be easily peeled or separated, so as to ensure the reliability of the display panel.

Of course, other desired patterns also may be formed on the electrode substrate 1 in the same way.

The electrode panel to be described in the following is an electrode panel of a flat panel display.

Figure 5:
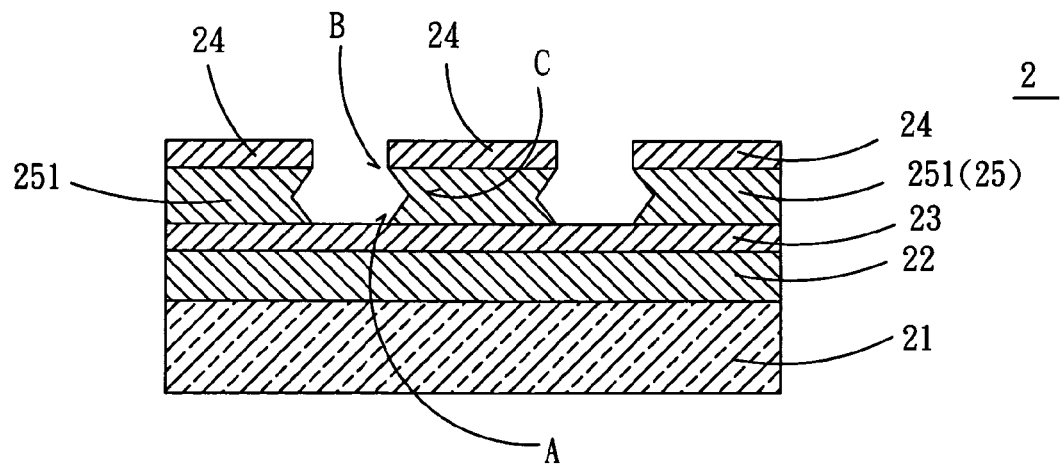
FIG. 5 is a schematic illustration showing an electrode substrate of a flat panel display according to a second embodiment of the invention.

Referring to FIG. 5, an electrode panel 2 of a flat panel display according to a second embodiment of the invention comprises a substrate 21, an electrode layer pattern 22, a first barrier layer pattern 23, a second barrier layer pattern 24, and a conductive line pattern 25. In this embodiment, the electrode layer pattern 22 is disposed on the substrate 21 and has a plurality of electrode lines 221. The first barrier layer pattern 23 is disposed on the electrode layer pattern 22, and the second barrier layer pattern 24 is disposed above the first barrier layer pattern 23. The conductive line pattern 25 is disposed between the first barrier layer pattern 23 and the second barrier layer pattern 24. The conductive line pattern 25 has at least one conductive line 231.

In this embodiment, the electrode lines 221 of the electrode layer pattern 22 are parallel with each other or one another.

The features and functions of the substrate 21, the electrode layer pattern 22, and the barrier layer patterns 23, 24 in this embodiment are the same as those of the substrate 11, the electrode layer 12 and the barrier layers 13, 14 in the first embodiment, and detailed descriptions thereof will be omitted.

With reference to FIG. 5, regarding to the shape of the cross-section of the conductive line 251, the middle portion (point C) of the conductive line 251 is narrower than the side portion (point A) close to the first barrier layer 23 and the side portion (point B) close to the second barrier layer 24. Herein, the adhesion area between the conductive line 251 and the electrode line 221 and the adhesion area between the conductive line 251 and the driving device (not shown) are larger than those of the prior art. Hence, the adhesions therebetween are more reinforced and the electrode line 221 cannot be easily peeled or separated, so as to ensure the reliability of the display panel.

The features and functions of the conductive line pattern 25 in this embodiment are the same as those of the conductive layer 15 in the first embodiment, and detailed descriptions thereof will be omitted.

The display panel to be described in the following is a display panel of a flat panel display.

Figure 6A:
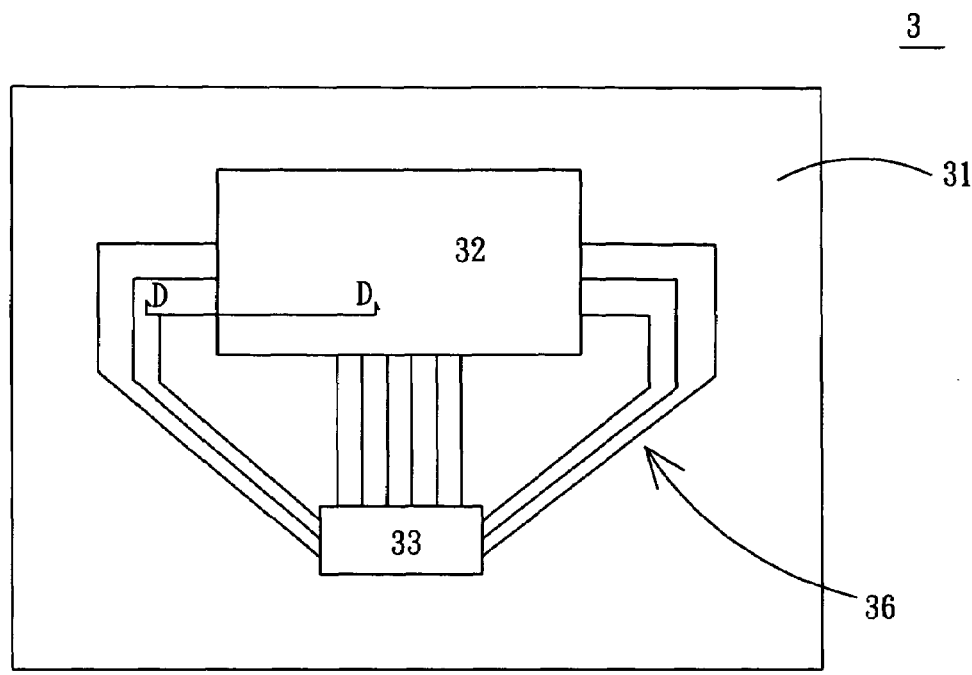
FIG. 6A is a schematic illustration showing a display panel of a flat panel display according to a third embodiment of the invention.
Figure 6B:
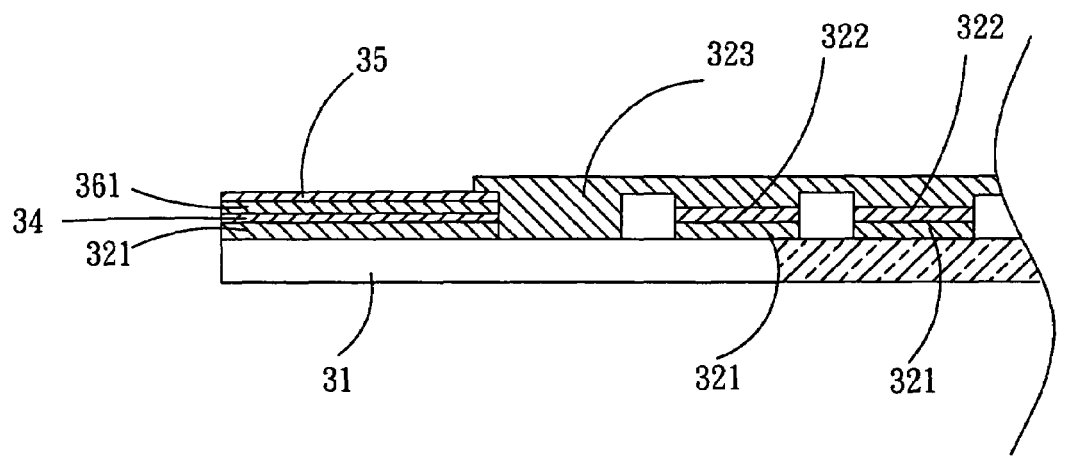
FIG. 6B is a cross-sectional view along a dashed line D-D of FIG. 6A.

Referring to FIGS. 6A and 6B, a display panel 3 of a flat panel display according to a third embodiment of the invention comprises a substrate 31, a light-emitting region 32, a driving device 33, a first barrier layer 34, a second barrier layer 35, and a conductive line pattern 36. The light-emitting region 32 has a plurality of pixels, and each of the pixels has a first electrode 321, a second electrode 323 and a light-emitting layer 322. The first electrode 321 is disposed on the substrate 31. The second electrode 323 is disposed above the first electrode 321. The light-emitting layer 322 is disposed between the first electrode 321 and the second electrode 323. The driving device 33 drives the pixels. The first barrier layer 34 is disposed above the substrate 31. The second barrier layer 35 is disposed above the first barrier layer 34. The conductive line pattern 36 is disposed between the first barrier layer 34 and the second barrier layer 35. The conductive line pattern 36 has a plurality of conductive lines 361 for connecting the first electrodes 321 to the driving device 33 and the second electrodes 323 to the driving device 33, respectively.

The following is the description of a display panel of an OEL display.

With reference to FIG. 6B, the pixel has a first electrode 321, a second electrode 323 and a light-emitting layer 322. The first electrode 321 is disposed on the substrate 31. The second electrode 323 is disposed above the first electrode 321. The light-emitting layer 322 is disposed between the first electrode 321 and the second electrode 323.

The features and functions of the first electrodes 321 in this embodiment are the same as those of the electrode layer 12 in the first embodiment, and detailed descriptions thereof will be omitted.

In addition, the light-emitting layer 322 is an organic functional layer. The organic functional layer usually contains a hole injection layer, a hole transporting layer, an emitting layer, an electron transporting layer, an electron injection layer, and the combination (not shown). The hole injection layer is mainly composed of copper phthalocyanine (CuPc), the hole transporting layer is mainly composed of 4,4'-bis[N-(1-naphthyl)-N-phenylamino]biphenyl (NPB), the electron injection layer is mainly composed of lithium fluoride (LiF), and the electron transporting layer is mainly composed of tris(8-quinolinato-N1,08)-aluminum (Alq). The organic functional layer can be formed by evaporation, spin coating, ink jet printing, or printing. In addition, the light emitted from the organic functional layer can be blue, green, red, white or other monochromatic light, or a color light as a combination of monochromatic lights. Wherein, the white light may be generated by mixing the orange light, which are generated by the orange material, with the complementary blue light, which are generated by the light-emitting material of complementary blue. Of course, other complementary light-emitting materials also may be utilized to generate the white light.

Furthermore, the second electrode 323 is disposed on the light-emitting layer 322. In this case, the second electrode 323 is formed on the light-emitting layer 322 by evaporation or sputtering. The material of the second electrode 323 can be aluminum, calcium, magnesium, indium, tin, manganese, silver, gold, magnesium-containing alloy such as magnesium-silver alloy, magnesium-indium alloy, magnesium-tin alloy, magnesium-antimony alloy and magnesium-tellurium alloy.

Referring to FIG. 6A again, the driving device 33 of this embodiment is for driving the pixels. Herein, the driving device 33 includes a driving chip.

Referring to FIGS. 6A and 6B again, the first barrier layer 34 of this embodiment is disposed above the substrate 31, and the second barrier layer 35 is disposed above the first barrier layer 34. When the display panel 3 works, the barrier layers 34, 35 may prevent the conductive lines 361 from the influence of the external oxygen or sulfur, and thus prevent the conductive lines 361 from being oxidized or even burnt out. When the conductive lines 361 are connected to the driving device 33, they would not be peeled or separated easily, so as to ensure the reliability of the display panel 3. The features and functions of the barrier layer 34, 35 and the substrate 31 in this embodiment are the same as those in the first embodiment, and detailed descriptions thereof will be omitted.

Next, referring to FIGS. 6A and 6B, the conductive line pattern 36 is disposed above the substrate 31, and has a plurality of conductive lines 361. The conductive lines 361 respectively connect the first electrodes 321 to the driving device 33 and the second electrodes 323 to the driving device 33. The features and functions of the conductive lines 361 in this embodiment are the same as those of the conductive line 151 in the first embodiment, and detailed descriptions thereof will be omitted.

In the invention, the flat panel display includes but not limited to an organic electroluminescent (OEL) display, an electroluminescent (EL) display, a light-emitting diode (LED) display, a liquid crystal display (LCD), a plasma display panel (PDP), a vacuum fluorescent display (VFD), a field emission display (FED), and an electro-chromic display.

As mentioned above, the display panel of this invention and its electrode substrate and electrode panel has two barrier layers for protecting the conductive layer (conductive lines). Compared to the prior art, the invention possesses the following advantages. Firstly, the barrier layers of the invention can prevent the conductive layer from being oxidized owing to the illumination of the UV light, and thus prevent the resistance of the conductive layer from increasing and enhance the adhesion between the conductive layer and the photoresist layer. Meanwhile, when the display panel works, the barrier layers also may prevent the conductive lines from the influence of the external oxygen or sulfur, and thus prevent the conductive lines from being oxidized or even burnt out. Secondly, the adhesions between the conductive lines and the driving device and between the conductive lines and the electrode layer can be improved owing to the barrier layers of the invention, which may further ensure the reliability of the display panel. Thirdly, the invention may further control the shape of the patterned conductive line. For example, regarding to the shape of the cross-section of the conductive line, the middle portion of the conductive line is narrower than the side portions close to the first barrier layer and the second barrier layer, wherein the shape looks like a sandglass. Thus, the adhesion area between the conductive line and the electrode layer and the adhesion area between the conductive line and the driving device are larger than those of the prior art. That is, if the area of the electrode substrate is fixed, the adhesion area between the conductive line and the electrode layer of the invention is larger than that of the prior art. Hence, the adhesions therebetween are more compact, so as to ensure the reliability of the display panel. Fourthly, the invention may be implemented using one single etchant, so that only one etching step is needed to etch the three-layer structure of the barrier layers and the conductive layer simultaneously. Fifthly, since the invention has simple manufacturing processes and the overall cost is not greatly increased, the invention is quite suitable for industrial application.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. An electrode substrate of a flat panel display, comprising:
   a substrate;
   an electrode layer disposed directly on the substrate;
   a first barrier layer disposed directly on the electrode layer;
   a conductive layer disposed directly on the first barrier layer; and
   a second barrier layer disposed directly on the conductive layer;
   wherein the first barrier layer and the second barrier layer are made of electrically conductive material, wherein the electrode layer, the first barrier layer, the conductive layer, and the second barrier layer are electrically and directly connected together to a same voltage level.

2. The electrode substrate according to claim 1, wherein the material of the conductive layer is at least one selected from the group consisting of aluminum, silver, copper, aluminum-containing alloy and copper-containing alloy.

3. The electrode substrate according to claim 1, wherein the material of the first barrier layer and the second barrier layer is at least one selected from the group consisting of platinum, gold, titanium, molybdenum, chromium, platinum-containing alloy, gold-containing alloy, titanium-containing alloy, molybdenum-containing alloy, and chromium-containing alloy.

4. The electrode substrate according to claim 1, wherein the substrate is a flexible substrate or a rigid substrate.

5. The electrode substrate according to claim 1, wherein the substrate is a plastic substrate or a glass substrate.

6. The electrode substrate according to claim 1, wherein a thickness of the conductive layer substantially ranges from 100 Å to 10000 Å.

7. The electrode substrate according to claim 1, wherein a thickness of the first barrier layer and the second layer substantially respectively range from 10 Å to 10000 Å.

8. An electrode panel of a flat panel display, comprising:
   a substrate;
   an electrode layer pattern disposed directly on the substrate, the electrode layer pattern having a plurality of electrode lines;
   a first barrier layer pattern disposed directly on the electrode layer pattern;
   a conductive line pattern disposed directly on the first barrier layer pattern; and
   a second barrier layer pattern disposed directly on the conductive line pattern
   wherein the first barrier layer pattern and the second barrier pattern are made of electrically conductive material, wherein the electrode layer pattern, the first barrier layer pattern, the conductive line pattern, and the second barrier layer pattern are electrically and directly connected together to a same voltage level.

9. The electrode panel according to claim 8, wherein in the cross-section of the conductive line, the middle portion of the conductive line is narrower than the side portions close to the first barrier layer pattern and the second barrier layer portion.

10. The electrode panel according to claim 8, wherein the material of the conductive line is at least one selected from the group consisting of aluminum, silver, copper, aluminum-containing alloy and copper-containing alloy.

11. The electrode panel according to claim 8, wherein the material of the first barrier layer pattern and the second barrier layer pattern is at least one selected from the group consisting of platinum, gold, titanium, molybdenum, chromium, platinum-containing alloy, gold-containing alloy, titanium-containing alloy, molybdenum-containing alloy, and chromium-containing alloy.

12. The electrode panel according to claim 8, wherein the electrode lines of the electrode layer pattern are parallel to each other.

13. The electrode panel according to claim 8, wherein a thickness of the conductive line pattern substantially ranges from 100 Å to 10000 Å.

14. The electrode panel according to claim 8, wherein a thickness of the first barrier layer pattern and the second layer pattern substantially respectively range from 10 Å to 1000 Å.

15. A display panel of a flat panel display, comprising:
   a substrate;
   a light-emitting region having a plurality of pixels, each of the pixels having a first electrode, a second electrode, and a light-emitting layer, wherein the first electrode is disposed directly on the substrate, the second electrode is disposed on the first electrode, and the light-emitting layer is disposed between the first electrode and the second electrode;
   a driving device for driving the pixels;
   a first barrier layer disposed directly on the substrate;
   a conductive line pattern disposed directly on the first barrier layer, wherein the conductive line pattern has a plurality of conductive lines, and the conductive lines connect the first electrodes to the driving device and the second electrodes to the driving device respectively; and
   a second barrier layer disposed directly on the conductive line pattern;
   wherein the first barrier layer and the second barrier are made of electrically conductive material, wherein the first barrier layer, the conductive line pattern, and the second barrier layer are electrically and directly connected together to a same voltage level.

16. The display panel according to claim 15, wherein the material of the conductive layer is at least one selected from the group consisting of aluminum, silver, copper, aluminum-containing alloy and copper-containing alloy.

17. The display panel according to claim 15, wherein the material of the first barrier layer and the second barrier layer is at least one selected from the group consisting of platinum, gold, titanium, molybdenum, chromium, platinum-containing alloy, gold-containing alloy, titanium-containing alloy, molybdenum-containing alloy, and chromium-containing alloy.

18. The display panel according to claim 15, wherein the driving device comprises a driving chip.

19. The display panel according to claim 15, wherein a thickness of the conductive layer substantially ranges from 100 Å to 10000 Å.

20. The display panel according to claim 15, wherein a thickness of the first barrier layer and the second barrier layer substantially respectively range from 10 Å to 1000 Å.

* * * * *